United States Patent
Kruspe et al.

(10) Patent No.: US 6,646,438 B2
(45) Date of Patent: *Nov. 11, 2003

(54) NMR DATA ACQUISITION WITH MULTIPLE INTERECHO SPACING

(75) Inventors: Thomas Kruspe, Wienhausen (DE); Martin Blanz, Celle (DE); Peter Rottengatter, Isernhagen (DE); Holger F. Thern, Hannover (DE)

(73) Assignee: Baker Hughes Incorporated, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/191,153

(22) Filed: Jul. 9, 2002

(65) Prior Publication Data

US 2003/0016013 A1 Jan. 23, 2003

Related U.S. Application Data

(63) Continuation-in-part of application No. 09/894,455, filed on Jun. 28, 2001.

(51) Int. Cl.⁷ ............................. G01V 3/00; G01R 33/20
(52) U.S. Cl. ........................................................ 324/303
(58) Field of Search ................. 324/303, 300, 324/306

(56) References Cited

U.S. PATENT DOCUMENTS

| | | | | |
|---|---|---|---|---|
| 4,502,007 A | * | 2/1985 | Mee et al. | 324/307 |
| 4,549,139 A | * | 10/1985 | MacFall et al. | 324/309 |
| 4,549,140 A | * | 10/1985 | MacFall et al. | 324/309 |
| 5,055,787 A | * | 10/1991 | Kleinberg et al. | 324/303 |
| 5,212,447 A | * | 5/1993 | Paltiel | 324/300 |
| 5,471,141 A | * | 11/1995 | Yoshida et al. | 324/314 |
| 5,557,201 A | * | 9/1996 | Kleinberg et al. | 324/303 |
| 5,585,720 A | * | 12/1996 | Edwards | 324/309 |
| 5,712,566 A | * | 1/1998 | Taicher et al. | 324/303 |
| 5,796,252 A | * | 8/1998 | Kleinberg et al. | 324/303 |
| 6,049,205 A | * | 4/2000 | Taicher et al. | 324/303 |
| 6,094,048 A | * | 7/2000 | Vinegar et al. | 324/303 |
| 6,121,774 A | * | 9/2000 | Sun et al. | 324/303 |
| 6,163,153 A | * | 12/2000 | Reiderman et al. | 324/314 |
| 6,326,785 B1 | * | 12/2001 | Kruspe | 324/303 |
| 6,344,744 B2 | * | 2/2002 | Taicher et al. | 324/303 |
| 6,377,042 B1 | * | 4/2002 | Menger et al. | 324/303 |
| 6,459,263 B2 | * | 10/2002 | Hawkes et al. | 324/303 |
| 6,522,136 B1 | * | 2/2003 | Hurlimann et al. | 324/303 |
| 6,570,382 B1 | * | 5/2003 | Hurlimann et al. | 324/303 |

FOREIGN PATENT DOCUMENTS

| | | | |
|---|---|---|---|
| EP | 0489578 A1 | * | 6/1992 |
| EP | 0967490 A2 | * | 12/1999 |
| WO | WO199701110 | * | 1/1997 |
| WO | WO00/13044 | * | 3/2000 |
| WO | WO01/42817 | * | 6/2001 |
| WO | WO01/59484 | * | 8/2001 |

\* cited by examiner

Primary Examiner—Louis Arana
Assistant Examiner—Tiffany A. Fetzner
(74) Attorney, Agent, or Firm—Madan, Mossman & Sriram, P.C.

(57) ABSTRACT

NMR data are acquired with variable spacing between refocusing pulses, giving data with a variable interecho time TE. Under certain conditions, diffusion effects can be neglected and data acquired with a multiple TE spacing may be used to obtain a $T_2$ distribution with increased resolution and reduced power requirements. In gas reservoirs, the maximum TE may be determined from diffusion considerations using a dual wait time pulse sequence and this maximum TE is used to acquire data with dual TE. By proper selection of TE, echos can be obtained with significantly reduced ringing.

5 Claims, 6 Drawing Sheets

NMR DATA ACQUISITION WITH MULTIPLE INTERECHO SPACING

CROSS-REFERENCES TO RELATED APPLICATIONS

This application is a continuation-in-part of U.S. patent application Ser. No. 09/894,455 filed on Jun. 28, 2001.

BACKGROUND OF THE INVENTION

1. Field of the Invention

This invention is related to methods for acquiring and processing nuclear magnetic resonance (NMR) measurements for determination of longitudinal and transverse relaxation times $T_1$ and $T_2$. Specifically, the invention deals with methods for acquiring NMR measurements using a modified CPMG sequences with a variable interecho spacing.

2. Description of the Related Art

Nuclear magnetic resonance is used in the oil industry, among others, and particularly in certain oil well logging tools. NMR instruments may be used for determining, among other things, the fractional volume of pore space and the fractional volume of mobile fluid filling the pore space of earth formations. Methods of using NMR measurements for determining the fractional volume of pore space and the fractional volume of mobile fluids are described, for example, in "Spin Echo Magnetic Resonance Logging: Porosity and Free Fluid Index Determination," M. N. Miller et al., Society of Petroleum Engineers paper no. 20561, Richardson, Tex., 1990. Further description is provided in U.S. Pat. No. 5,585,720, of Edwards, issued Dec. 17, 1996 and having the same assignee as the present application, entitled "Signal Processing Method For Multiexponentially Decaying Signals And Applications To Nuclear Magnetic Resonance Well Logging Tools." The disclosure of the Edwards patent is fully incorporated herein by reference.

Deriving accurate transverse relaxation time $T_2$ relaxation spectra from nuclear magnetic resonance (NMR) data from logging subterranean formations, or from Cores from such formations, is critical to determining total and effective porosities, irreducible water saturations, and permeabilities of the formations. As discussed in Prammer (U.S. Pat. No. 6,005,389), the total porosity is the fractional volume of a rock that is occupied by fluids. The total porosity (e.g. measured by a density tool) includes clay bound water that typically has extremely short relaxation times, moveable water and hydrocarbons that have long relaxation times, and capillary bound water that has intermediate relaxation times. The effective porosity is defined as that portion of the pore volume containing fluids that are moveable, i.e., the total porosity minus the clay bound water. Accurate spectra are also essential to estimate $T_2$ cutoff values and to obtain coefficients for the film model or Spectral Bulk Volume Irreducible (SBVI) model. Effective porosities are typically summations of partial porosities; however, distortion of partial porosity distributions has been commonly observed for a variety of reasons. These reasons include poor signal-to-noise ratio (SNR), and poor resolution in the time domain of the NMR data.

U.S. Pat. No. 6,069,477 to Chen et al having the same assignee as the present application discusses the constituents of a fluid saturated rock and various porosities of interest. Referring to FIG. 1, the solid portion of the rock is made up of two components, the rock matrix and dry clay. The total porosity as measured by a density logging tool is the difference between the total volume and the solid portion. The total porosity includes clay-bound water, capillary bound water, movable water and hydrocarbons. The effective porosity, a quantity of interest to production engineers is the sum of the last three components and does not include the clay bound water.

The most common NMR log acquisition and core measurement method employs $T_2$ measurements using CPMG (Carr, Purcell, Meiboom, and Gill) sequence, as taught by Meiboom and Gill in "Modified Spin-Echo Method for Measuring Nuclear Relaxation Time," Rev. Sci. Instrum. 1958, 29, pp. 688–691. In this method, the echo data in any given echo train are collected at a fixed time interval, the interecho time (TE). Usually, a few hundred to a few thousand echos are acquired to sample relaxation decay. However, for determination of CBW, echo sequences of as few as ten echos have been used.

Interecho time (TE), is one of the most important, controllable experimental parameters for CPMG measurements and can affect data interpretation. In logging operations using the MRIL® tool (made by Numar Corp.), TEs of 0.6 and 1.2 milliseconds (ms) are typically used to manipulate the relaxation decay data to include or exclude clay bound water (CBW) porosity.

Interpretation of NMR core or log data is often started by inverting the time-domain CPMG echo decay into a $T_2$ parameter domain distribution. In general, the $T_2$ of fluids in porous rocks depends on the pore-size distribution and the type and number of fluids saturating the pore system. Because of the heterogeneous nature of porous media, $T_2$ decays exhibit a multiexponential behavior. The basic equation describing the transverse relaxation of magnetization in fluid saturated porous media is $$M(t) = \int_{T_{2min}}^{T_{2max}} P(T_2) e^{-t/T_2} dT_2 \quad (1)$$

where M is magnetization, and effects of diffusion in the presence of a magnetic field gradient have not been taken into consideration. Eq.(1) is based on the assumption that diffusion effects may be ignored. In a gradient magnetic field, diffusion causes atoms to move from their original positions to new ones which also causes these atoms to acquire different phase shifts compared to atoms that did not move. This contributes to a faster rate of relaxation.

The effect of field gradients is given by an equation of the form $$\frac{1}{T_2} = \frac{1}{T_{2bulk}} + \frac{1}{T_{2surface}} + \frac{1}{T_{2diffusion}} \quad (2)$$

where the first two terms on the right hand side are related to bulk relaxation and surface relaxation while the third term is related to the field gradient G by an equation of the form $$T_{2diffusion} = \frac{C}{TE^2 \cdot G^2 \cdot D} \quad (3)$$

where TE is the interecho spacing, C is a constant and D is the diffusivity of the fluid.

In CPMG measurements, the magnetization decay is recorded (sampled) at a fixed period, TE; thus, a finite number of echos are obtained at equally spaced time intervals, t=n TE, where n is the index for the n-th echo. This may be denoted by $$M(nTE) = \int_{T_{2\min}}^{T_{2\max}} P(T_2)e^{-nTE/T_2} dT_2 + \text{noise} \qquad (4)$$

A problem associated with conventional CPMG sequences is that the resolvability of the $T_2$ spectrum is not uniform. Short $T_2$ s are poorly resolved as only a few data points are affected by these components. Long $T_2$ s, on the other hand, are oversampled. In addition, due to limitations on availability of power, the number of pulses is limited: this has the undesirable effect of leading to poor resolution of short $T_2$ components because measurements have to be made over long time to resolve the slowly relaxing components. The actual selection of TE and number of pulses involves a tradeoff governed by the power availability and the desire for rapid acquisition to keep down rig costs.

As discussed in U.S. Pat. No. 6,069,477 to Chen et al, the contents of which are fully incorporated herein by reference, the effects of noise, sampling rate, and the ill-conditioning of inversion and regularization are to smear (broaden) the estimated $T_2$ distribution. In addition, because of the non-orthogonality of multi-exponential signals, CBW signals could be shifted to higher $T_2$ regions if the $T_2$ fitting region is limited or if the regularization is excessive. This distortion is not easily rectified; even adding more bins with short $T_2$ does not reduce the distortion of the $T_2$ spectra.

Chen et al teaches the use of CPMG sequences with two different values of TE (0.6 ms and 1.2 ms). A time domain correction is used to filter out the contribution of the fast relaxing $T_2$ components in the TE=1.2 ms echo train. High S/N echo data with sampling time TE=0.6 ms are used to obtain the CBW $T_2$ distribution. These data are then used to reconstruct CBW contributions to the time domain early echos of the conventional effective porosity echo data (TE= 1.2 ms). The CBW signal is then subtracted from the original echos, and the effective porosity distribution is estimated from the reconstructed echo train. Other methods can be applied to jointly process echo train data with different TEs (e.g., Dunn et al., 1998, "A method for inverting NMR data sets with different signal to noise ratios" paper JJ, in 39th annual logging symposium transactions SPWLA).

The use of two different CPMG sequences with different values of TE may still lead to erroneous results in measurement-while-drilling applications. The reason is that due to tool motion, the sensitive volume may be different for the first and second CPMG sequence. The region of investigation for an NMR logging tool is defined by the region in the formation wherein the Larmor frequency of nuclear spins matches the RF frequency of the tipping pulse. Subsequent refocusing pulses in a CPMG sequence will produce spin-echo signals from this region. When the tool is in motion, as in a MWD logging tool, the region of investigation may be different for successive CPMG sequences, so that the spin echos for a second CPMG sequence may not come from the same region as the spin echos for a first CPMG sequence. It would be desirable to have a method of obtaining an NMR spectrum of a medium with a resolution that is more uniform over the range of spectral values and that is not sensitive to tool motion, particularly in MWD applications. Such a method should preferably also have reduced power consumption. The present invention satisfies this need.

SUMMARY OF THE INVENTION

The present invention is a method of acquiring NMR spin echo signals using pulse sequences having more than one interecho spacing. This makes it possible to acquire relaxation spectra with high resolution of rapidly relaxing components and reduced power requirements over the slowly relaxing portions of relaxation spectra. Multiple TE data may be acquired when different types of fluids are present in the formation to resolve the fast decaying components as well as the slow decaying components. In a gradient field the diffusion effect has to be considered for selection of proper TE values.

In a preferred embodiment, the method is used with a zero gradient magnetic field configuration. This reduces the effects of diffusion on the echo signals. Power requirements may be further reduced by using refocusing pulses with an angle of less than 180°.

Signal to noise ratio may be further improved by using a plurality of pulse sequences and stacking the resulting signals. By proper selection of the variable TE sequences a desired resolution may be obtained for all expected components (short, medium, and long) while reducing the required time and the required power. This is particularly important in the resolution of short $T_2$ components.

When used for measurement-while-drilling, optional embodiments of the invention use motion sensors on the drilling assembly and the timing of the pulses in the pulse sequences is based in part on the output of the motion sensors. Optionally, predictive filtering of the motion signals may be used to further improve the signal to noise ratio.

DETAILED DESCRIPTION OF THE INVENTION

A suitable device for use of the present invention, is disclosed in U.S. Pat. No. 6,215,304 to Slade, the contents of which are fully incorporated herein by reference. It should be noted that the device taught by Slade is for exemplary purposes only, and the method of the present invention may be used with many other NMR logging devices, and may be used for wireline as well as MWD applications. Examples of such devices are given in U.S. Pat. No. 5,557,201 to Kleinberg, U.S. Pat. No. 5,280,243 to Miller, U.S. Pat. No. 5,055,787 to Kleinberg, and U.S. Pat. No. 5,698979 to Taicher.

Figure 1:
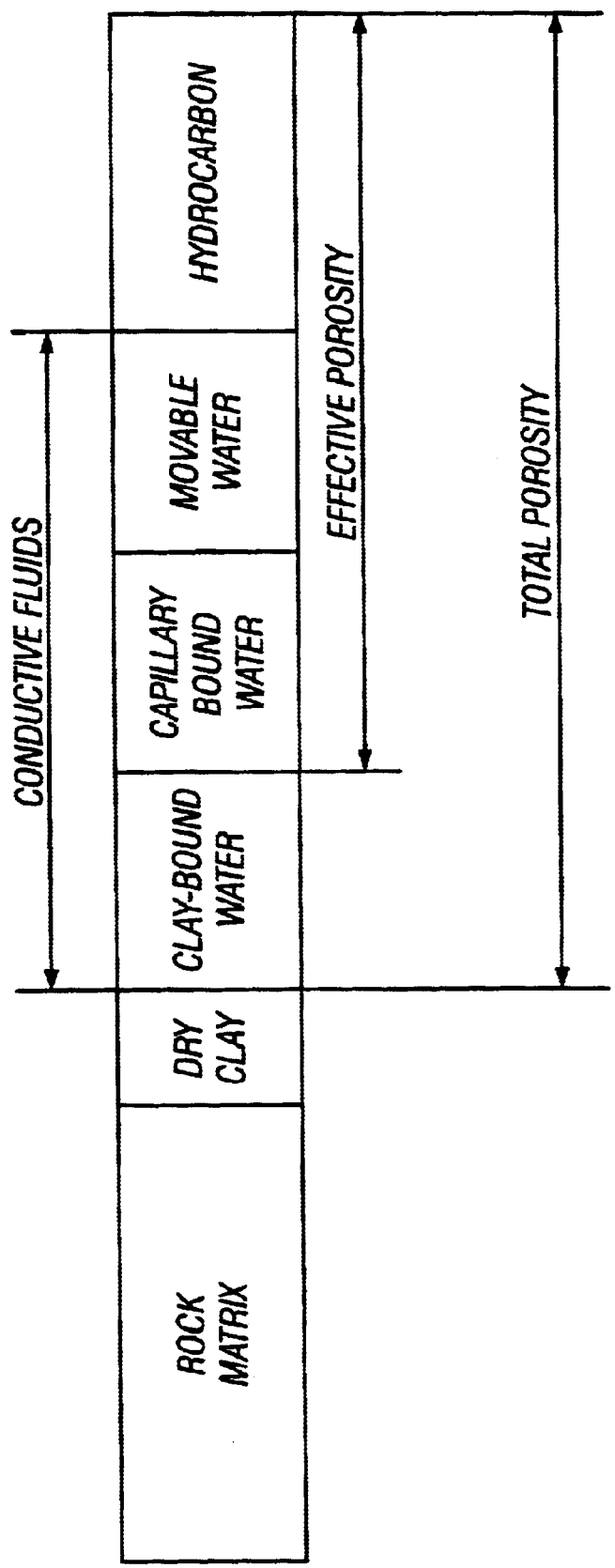
FIG. 1 shows the different constituents of a fluid filled rock.
Figure 2:
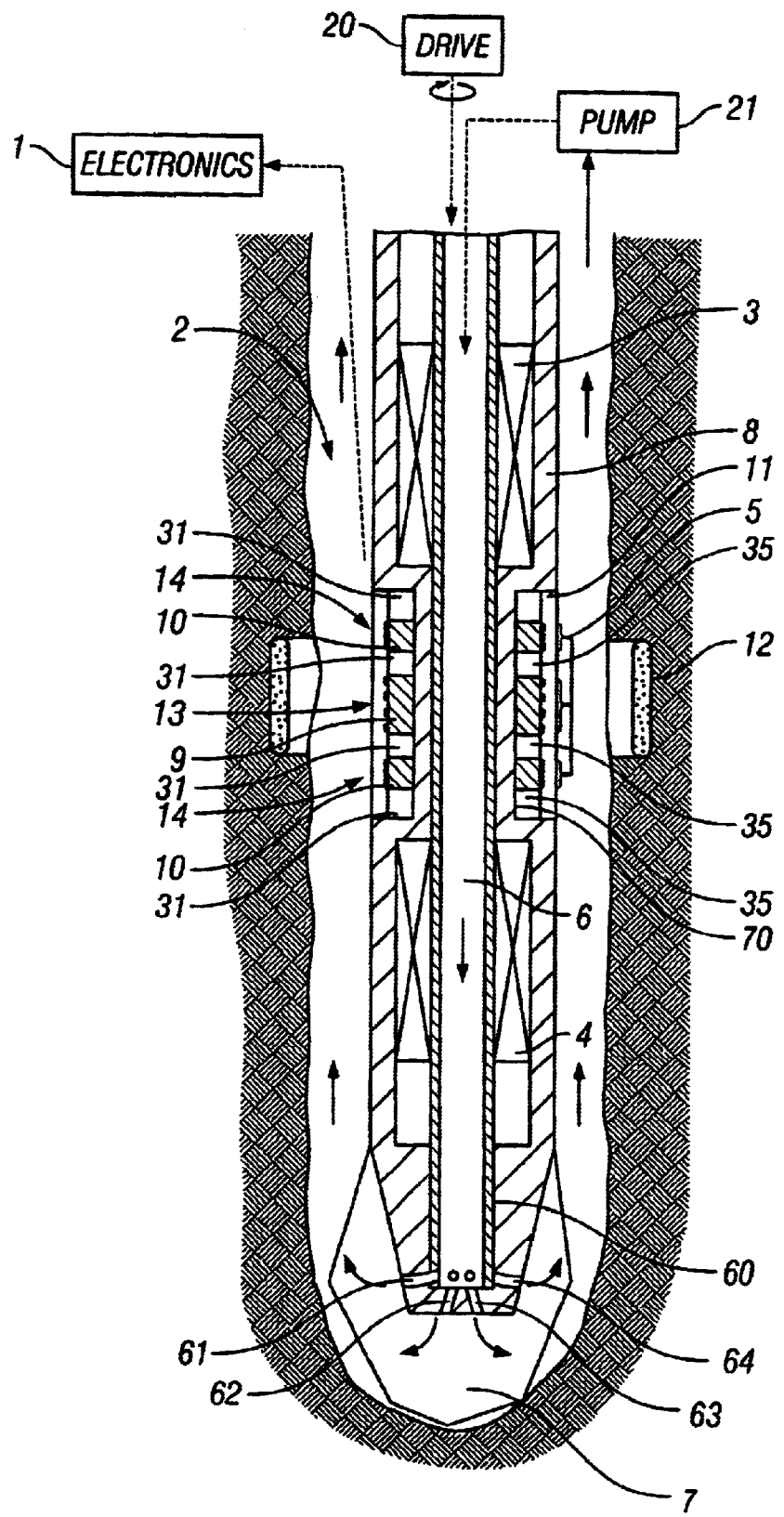
FIG. 2 (PRIOR ART) is a schematic cross-section of a NMR measurement-while-drilling tool in a borehole

Referring now to FIG. 2, the tool has a drill bit 7 at one end, a sensor section 2 behind the drill head, and electronics 1. The sensor section 2 comprises a magnetic field generating assembly for generating a $B_0$ magnetic field (which is substantially time invariant over the duration of a measurement), and an RF system for transmitting and receiving RF magnetic pulses and echos. The magnetic field generating assembly F comprises a pair of axially spaced main magnets 3,4 having opposed pole orientations (i.e. with like magnetic poles facing each other), and three soft magnetic members 9,10 axially arranged between the magnets 3,4. The soft magnetic members can be distinguished over "hard" magnetic material by the shape of the BH curve(hysteresis). Permanent magnets are characterized by hysteresis curve that encloses a large area while in an ideal soft magnet there is no hysteresis at all. Real soft magnetic material do show a small hysteresis. The slope of the BH curve is identical to the magnetic field constant (or absolute permeability) $\mu_0$ times the (relative) permeability $\mu_r$. Usual soft magnetic materials are NiFe alloys, soft ferrites, polymer bound iron powder or amorphous metals. The permeability typically ranges from about 10 (polymer bound iron powder) to 100000 (amorphous metal). Where RF magnetic field needs to penetrate the soft magnet, electrically nonconductive or layered conductive material need to be used. Examples for non-conductive materials are ferrites or polymer bound iron powder. The RF system comprises a set of RF transmit antenna and RF receive antenna coil windings 5 arranged as a central "field forming" solenoid group 13 and a pair of outer "coupling control" solenoid groups 14.

The tool has a mud pipe 60 with a clear central bore 6 and a number of exit apertures 61–64 to carry drilling mud to the bit 7, and the main body of the tool is provided by a drill collar 8. Drilling mud is pumped down the mud pipe 60 by a pump 21 returning around the tool and the entire tool is rotated by a drive 20. Coded tubing or a drillstring may be used for coupling the drive to the downhole assembly.

The drill collar 8 provides a recess 70 for RF transmit antenna and RF receive antenna coil windings 5. Gaps in the pockets between the soft magnetic members are filled with non-conducting material 31, 35 (e.g.: ceramic or high temperature plastic) and the RF coils 13, 14 are then wound over the soft magnetic members 9, 10. The soft magnetic material 9, 10 and RF coil assembly 13, 14 are pressure impregnated with suitable high temperature, low viscosity epoxy resin (not shown) to harden the system against the effects of vibration, seal against drilling fluid at well pressure, and reduce the possibility of magnetoacoustic oscillations. The RF coils 13, 14 are then covered with wear plates 11 typically ceramic or other durable non-conducting material to protect them from the rock chippings flowing upwards past the tool in the borehole mud.

Because of the opposed magnet configuration, the device of Slade has an axisymmetric magnetic field and region of investigation 12 that is unaffected by tool rotation. Use of the soft magnetic material results in a region of investigation that is close to the borehole. This is not a major problem on a MWD tool because there is little invasion of the formation by borehole drilling fluids prior to the logging. The region of investigation is a shell with a radial thickness of about 20 mm and an axial length of about 50 mm. The gradient within the region of investigation is less than 2.7 G/cm. It is to be noted that these values are for the Slade device and, as noted above, the method of the present invention may also be used with other suitable NMR devices.

Figure 3:
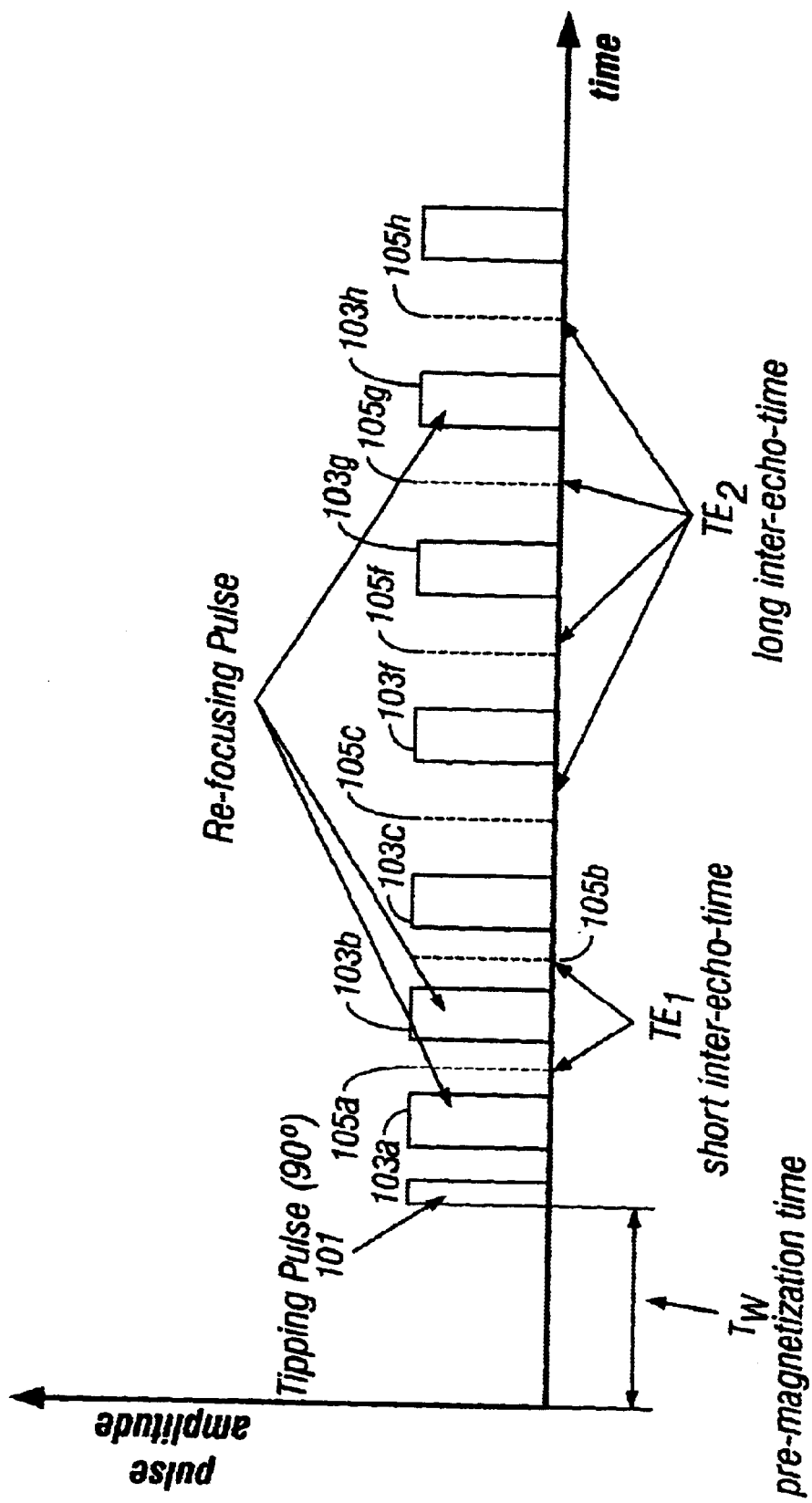
FIG. 3 shows an example of a pulse sequence with non-uniform interecho times.

Turning now to FIG. 3, an exemplary pulse sequence according to the method of the present invention is disclosed. Following a wait time of $T_w$, the nuclear spins in the region of investigation will be aligned substantially parallel to the direction of the static magnetic field. At the end of the wait time, a 90° tipping pulse 101 is applied. The effect of this is to tip the nuclear spins into a plane orthogonal to the direction of the static field. At the end of the tipping pulse, the nuclear spins start precessing in this orthogonal plane and also dephasing with a time constant $T_2^*$ due mainly to B0 field inhomogeneities in the static magnetic field $B_0$. Using the CPMG pulse sequence this $T_2^*$ dephasing effect is cancelled and the resulting spin echo train amplitudes decay with time constant $T_2$. Application of a refocusing pulse 103a reverses the direction of precession so that at a time 105a a spin echo signal is produced that may be detected by the antenna. Subsequent refocusing pulses 103b, 103c . . . 103f, 103g, 103h will produce additional spin echo signals 105b, 105c, . . . , 105g. At the end of the tipping pulse, the nuclear spins start precessing in this orthogonal plane and also dephasing with a time constant $T_2^*$ due mainly to B0 field inhomogeneities in the static magnetic field $B_0$. Using the CPMG pulse sequence this $T_2^*$ dephasing effect is cancelled and the resulting spin echo train amplitudes decay with time constant $T_2$. Application of a refocusing pulse 103a reverses the direction of precession so that at a time 105a a spin echo signal is produced that may be detected by the antenna. Subsequent refocusing pulses 103b, 103c . . . 103f, 103g, 103h will produce additional spin echo signals 105b, 105c, . . . , 105g.

A novel feature of the present invention is that the spacing between the refocusing pulses need not be uniform. In the example shown in FIG. 3, the time interval between the refocusing pulses 103a, 103b and 103c is less than the time interval between later pulses 103e, 103f, 103g,. If additional intervals are used, the spacing may be even larger.

Figure 4:
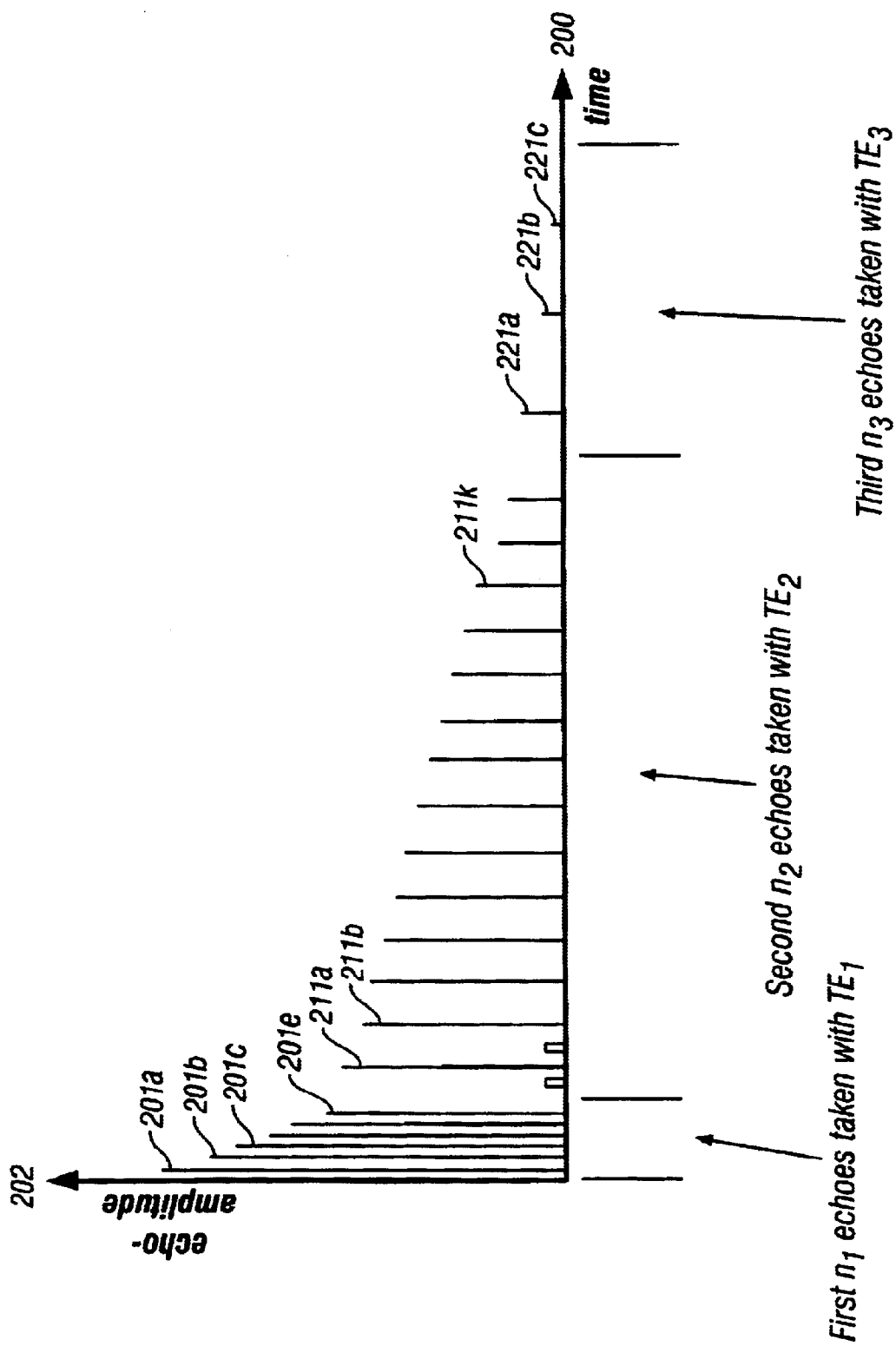
FIG. 4 shows the sampling of a decay curve using 3 different interecho times.

Turning now to FIG. 4, the spin-echo signals obtained by the pulse sequence such as that shown in FIG. 3 are shown. The abscissa 200 is time and the ordinate 202 is the echo amplitude A first plurality $n_1$, of echos 201a, 201b, 201c. 201d, 201e are obtained with a spacing $T_{E1}$, these are followed by a second plurality $n_2$ of echos 211a 411b . . . 211k obtained with a spacing $T_{E2}$ and may be followed by additional pluralities $n_3$ of echos 221a 221b, 221c, obtained with a spacing $T_{E3}$ etc. As can be seen, using the sequence of FIG. 3 results in the early part of the sequence (where the amplitudes decay rapidly, corresponding to small relaxation times) being more closely sampled than the latter part of the sequence (where the amplitude decay is slow, corresponding to long relaxation times). In order to generate an NMR-echo decay with the timing in FIG. 4, which has three distinct interecho times $T_{E1}, T_{E2}$ and $T_{E3}$ it is necessary to increase the time between refocusing pulses $T_P$ at each transition between two $T_E$s in two steps. This is shown in FIG. 3; between the times $T_{P1}$ and $T_{P2}$, a transition time $T_{PT}=(T_{P1}+T_{P2})/2$ is inserted. Otherwise the spin echo after a transition would not form midway between two refocusing pulses.

The sparse sampling of the later portions of the echo train also means that the overall duty cycle on the power source is reduced. This makes it possible to sample large relaxation components without unduly burdening the power supply.

Those versed in the art would recognize that one effect of the variation in the interecho spacing may be a variation in $T_2$ due to diffusion effects. The diffusion effects are proportional to the square of the field gradient and the interecho spacing and directly proportional to the diffusivity of the fluid. This effect is minimized by the magnet design in the Slade device; with a field gradient of less than 3.0 G/cm, the effect of diffusion of bulk water (with $T_{2B}$=2.5 s) at room temperature is negligible for TE up to 2 ms, while at 150° C., the effect is small for TE up to 0.8 ms. For water in a porous medium the TE values will increase depending on the pore size. In general, diffusion effects are small for water, heavy oil, medium oil and light oil but may not be negligible for gas or very light liquids and condensate.

U.S. Pat. No. 6,331,775 of Thern et al, the contents of which are incorporated herein by reference, teaches the use of a dual wait time echo data for determination of gas saturation in the formation. The wait times are selected to substantially polarize the liquid phase but to produce substantially different polarization of the gas phase. In one embodiment of the invention, dual wait time data are acquired and, on the basis of evaluation of the results in a downhole processor, an estimate of the gas saturation is made. Based on this estimate, a maximum allowable TE is determined and subsequent data are acquired with a dual TE pulse sequence wherein the first few echos (up to 10) are acquired with a short TE (e.g. of 0.5 ms), enhancing the resolution of short $T_2$ s and the remaining echos are acquired with a longer but fixed TE (e.g., 2–4 ms).

U.S. Pat. No. 6,005,389 to Prammer teaches the use of a plurality of pulse sequences with short TE s (approximately 0.5 ms) and summing the echo trains to improve the signal to noise ratio of the earliest pulse echos. Using this summed data, Prammer teaches the determination of rapidly relaxing components of the $T_2$ distribution. In one embodiment of the present invention, a plurality of pulse trains with variable TE are acquired and by stacking the signals, the entire $T_2$ distribution may be obtained. This makes it possible to determine the total porosity, clay bound water and effective porosity. In an optional embodiment of the present invention, the variable TE method of the present invention may also be used in conjunction with a plurality of wait times $T_w$.

In one embodiment of the invention, the choice of TE is made during the drilling process. Dual or multiple TW data are acquired during the process of drilling using a fixed TE using prior art methods. Evaluation of these data makes it possible to estimate the $T_1$ and the $T_2$ distribution in real time using a downhole processor. The estimation of the $T_2$ distribution may be done directly or indirectly using a fixed relation between $T_1$ and $T_2$. Knowing the maximum value of $T_2$ for the formation, the maximum TE is estimated using eqs.(2) and (3). The field gradient is a known quantity and the diffusivity is estimated from knowledge of the fluid type, the rock type and the porosity. The fluid type, rock type and porosity are determined downhole from other logs such as density, gamma ray and resistivity logs.

Figure 5:
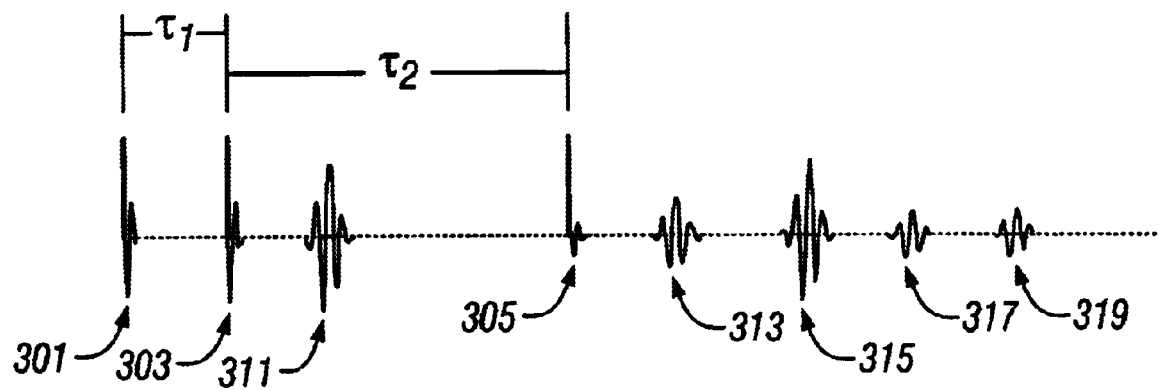
FIG. 5 shows echos created by the transition from short interecho time to a long one.

A particular advantage of the present pulse sequence is that the same 90° tipping pulse is used for obtaining data at a single frequency with a variable interecho spacing. This avoids problems of different regions of excitation that may be caused by transversal tool motion when the multiple frequency method of Chen et al is used. However, the use of a varying TE results in a more complicated sequence of echos. This is illustrated in FIG. 5 wherein after an initial tipping 90° pulse 301 there is 180° refocusing pulse 303 delayed by time $\tau_1$ and a second refocusing pulse 305 at a time $\tau_2$ after the first refocusing pulse. The pulse echo 311 results from the tipping pulse 301 and the first refocusing pulse 303. Following the second refocusing pulse 305, four echos are produced at times $2\tau_1+\tau_2$, $2\tau_2$, $\tau_1+2\tau_2$, and $2\tau_1+2\tau_2$. In FIG. 5 these echos are labeled 313, 315, 317 and 319 respectively. The earliest of these echos 313 is produced by all three RF pulses 301, 303 and 305 and is known in the NMR literature as the stimulated echo. The second echo 315 after the refocusing pulse 305 is the so-called secondary echo and also produced by all three pulses. The further echos 317 and 319 are two-pulse echos caused by the first or second pulse together with the third pulse. Of all these NMR signals, echo 315 would be typically the most useful, but the other echos may be acquired as well. Details of the three-pulse echo generation can be found in chapter 2.2, FIG. 2.2 of R. Kimmich "NMR—Tomography, Diffusometry, Relaxometry", ISBN 3-540-61822-8, Springer-Verlag Berlin Heidelberg N.Y.

The echos 313, 317 and 319 would only be present where the refocusing pulse is not 180°. For a NMR sample of limited size, for which the frequency band width of the refocusing pulse is much greater than the bandwidth of NMR frequencies of the sample and the refocusing pulses are 180°, the echos would be as shown in FIG. 4. In the practice of oil well logging such an ideal situation is virtually impossible so that there would be echos in addition to those shown in FIG. 4. These additional echos are indicated in FIG. 3 as 107d, 107e, 107f . . . As a result of this, the centered echos (105d, 105e, 105f) after the change of TE are of lower amplitude than before the change. Before the evaluation of the relaxation measurement these later echos need to be scaled by correction factors similar to the well known "stimulated echo correction factors".

Figure 3A:
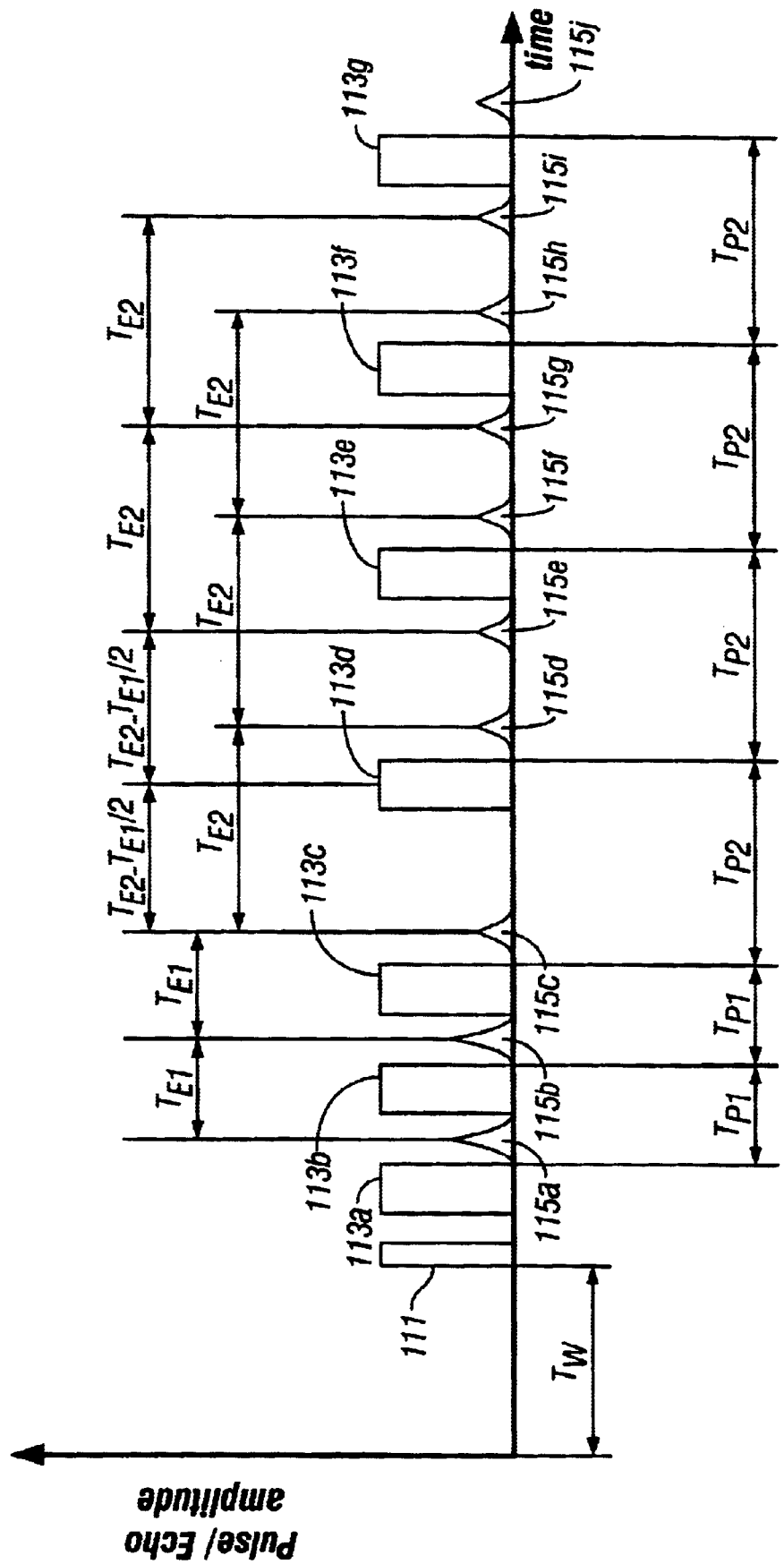
FIG. 3a shows an alternative example of a pulse sequence with non-uniform interecho times.

The aim of the pulse sequence in FIG. 3, which uses a transitional inter pulse time $T_{PT}$ at the change from $TE_1$ to $TE_2$, is the generation of echos midway between two pulses. This, however, is not essential. FIG. 3a shows an example of a pulse sequence that changes the inter pulse time from $T_{P1}$ to $T_{P2}$ without a transitional time step. Two echos between each two pulses are formed after the $T_P$ step, i.e. echo pairs 115d/115e, 115f/115g, 115h/115i etc. Both echos of each pair may be acquired, thereby increasing the total acquired NMR signal. These later echos are reduced in amplitude with respect to the earlier echos 115a to 115c and need to be corrected with correction factors before evaluating the $T_2$ relaxation time distribution. If at a later time the interpulse spacing is increased again, even more echos may be generated and can be acquired if desired.

FIG. 3a illustrates also another interesting aspect of the multiple TE measurement. The unequal spacing of pulses can be used to generate echos that appear not midway between pulses but later, closer to the later pulse. The later echo may be of good quality while the earlier echo or even an echo in the center between pulses may be distorted due to ringing (e.g. acoustic or electronic ringing). The unequal RF pulse spacing, therefore, allows the acquisition of echos in situations of short TE where conventional centered CPMG echos may be distorted excessively by ringing.

Those versed in the art would recognize that in a conventional CPMG sequence, each of the refocusing pulses has a duration and amplitude designed to change the angle by 180°. One embodiment of the invention uses refocusing pulses with a smaller tipping angle. Such a pulse sequence has been disclosed in U.S. Pat. No. 6,163,153 to Reiderman et al, the contents of which are fully incorporated herein by reference.

One embodiment of the present invention uses the teachings of co-pending U.S. patent application Ser. No. 09/778, 205 of Hawkes et al, the contents of which are incorporated herein by reference. Hawkes et al teaches the use of motion triggered pulsing for NMR measurements. The motion of the tool is measured by suitable motion sensors, such as accelerometers, magnetometers or gyroscopes or combinations thereof. These sensors may be placed at any suitable location on the drilling tool in the proximity of the magnet and coil arrangement. The wait period in a pulse sequence may be extended slightly without affecting the data quality and this feature may be used to delay the application of the tipping pulse until a suitable state of tool motion is achieved. The trigger may be obtained by monitoring the motion sensor signals. Suitable states for triggering are instantaneous moments when the tool is stationary, or if the motion has a strong periodic component, then subsequent pulse sequences may be triggered to synchronize with this motion. Such motion triggered pulsing will improve the NMR spin-echo formation.

It is common practice in NMR measurements to make multiple measurements of pulse echos and to average the measurements. The Hawkes application also teaches the use of a predictive filter using the output of the motion sensors to predict the motion of the drillstring. In the case of motion containing one or more periodic components, using the output of the predictive filter, data acquisitions can be triggered when the NMR tool is in approximately the same position, stationary or in the same state of motion, and the data averaged to improve the signal to noise ratio.

An optional embodiment of the invention that may be used with any of the pulse sequences described above is used to reduce the effect of ringing. In the so-called phase alternated pulse (PAP) sequence, the successive CPMG or modified CPMG sequences are acquired with alternating phases of the tipping pulse. Summing the echos from such a PAP sequence reduces the effects of ringing.

While the foregoing disclosure is directed to the preferred embodiments of the invention, various modifications will be apparent to those skilled in the art. It is intended that all variations within the scope and spirit of the appended claims be embraced by the foregoing disclosure.

What is claimed is:

1. A method for determining a parameter of interest of a volume of earth formation surrounding a borehole with a Nuclear Magnetic Resonance (NMR) logging tool conveyed in the borehole, the method comprising:

(a) using a magnet assembly on the NMR logging tool to produce a static magnetic field in said volume of the formation;

(b) producing a radio frequency (RF) magnetic field in said volume of the formation with an antenna on the logging tool, said RE magnetic field having a component in a direction orthogonal to a direction of the static field, the RF field including at least one pulse sequence comprising a tipping pulse and at least four refocusing pulses, each refocusing pulse producing at least one corresponding spin echo signal; and (c) measuring with the logging tool spin echo signals induced by the RE field in the formation; wherein at least three successive later ones of said at least four refocusing pulses of a single one of said at least one pulse sequence have a time intervals greater than time intervals between earlier successive refocusing pulses, and wherein at least one of said at least four refocusing pulses produces more than one echo signal.

2. The method of claim 1 further comprising selecting a time of occurrence of at least one of said at least three refocusing pulses to produce a spin echo signal substantially midway between a pair of said at least three refocusing pulses.

3. The method of claim 1 further comprising selecting a time of occurrence of at least one of said at least three refocusing pulses to produce a spin echo signal later than midway between a pair of said at least three refocusing pulses.

4. The method of claim 3 wherein said later spin echo signal shows substantially less ringing artefacts than another echo between said pair of refocusing pulses.

5. The method of claim 1 wherein the at least one pulse sequence comprises a plurality of pulse sequences, one of said plurality of pulse sequences having a wait time before the tipping pulse different from a wait time before the tipping pulse of another of said plurality of pulse sequences.

* * * * *